United States Patent [19]

Nishimura et al.

[11] Patent Number: 4,712,013

[45] Date of Patent: Dec. 8, 1987

[54] METHOD OF FORMING A FINE PATTERN WITH A CHARGED PARTICLE BEAM

[75] Inventors: Eiji Nishimura; Tadahiro Takigawa; Yoshihide Kato, all of Kawasaki, Japan

[73] Assignee: Kabushiki Kaisha Toshiba, Kawasaki, Japan

[21] Appl. No.: 45,160

[22] Filed: May 4, 1987

Related U.S. Application Data

[63] Continuation of Ser. No. 778,795, Sep. 23, 1985, abandoned.

[30] Foreign Application Priority Data

Sep. 29, 1984 [JP] Japan ............... 59-204426
Sep. 29, 1984 [JP] Japan ............... 59-204437
Mar. 5, 1985 [JP] Japan ............... 60-43448

[51] Int. Cl.$^4$ ............................................. H01J 37/00
[52] U.S. Cl. ............................................. 250/492.2
[58] Field of Search ........... 250/492.2, 492.22, 492.24, 250/398

[56] References Cited

U.S. PATENT DOCUMENTS

| | | | |
|---|---|---|---|
| 4,099,062 | 7/1978 | Kitcher | 250/492.2 |
| 4,264,711 | 4/1981 | Greeneich | 250/492.2 |
| 4,298,803 | 11/1981 | Matsuura et al. | 250/492.2 |
| 4,392,058 | 7/1983 | Smith | 250/492.2 |
| 4,426,584 | 1/1984 | Bohlen et al. | 250/492.2 |
| 4,463,265 | 7/1984 | Owen et al. | 250/492.2 |
| 4,504,558 | 3/1985 | Bohlen et al. | 250/492.2 |

FOREIGN PATENT DOCUMENTS

| | | | |
|---|---|---|---|
| 97903 | 1/1984 | European Pat. Off. | 250/492.2 |
| 52-117077 | 10/1977 | Japan . | |
| 56-46258 | 10/1981 | Japan . | |
| 59-921 | 1/1984 | Japan . | |

OTHER PUBLICATIONS

"Automatic Electron Beam Fabrication of Micron-size Devices", *Scanning Electron Microsopy*, Wilson et al., 4-1976.

Primary Examiner—Bruce C. Anderson
Attorney, Agent, or Firm—Oblon, Fisher, Spivak, McClelland, & Maier

[57] ABSTRACT

A method of forming a fine pattern with a charged beam, comprises steps of irradiating, with a charged beam, a predetermined region of a sample to form an exposure pattern on the sample, and irradiating, with at least one of a charged beam or an electromagnetic wave, and at a dose smaller than the dose for forming the main pattern, the entire surface of the specific pattern and nonpattern regions around the specific pattern region to perform an auxiliary exposure. The step of performing the auxiliary exposure is performed at a high voltage of, for example, more than 30 KeV so as not to change the molecular distribution along the direction of thickness of an irradiated portion of the sample.

17 Claims, 39 Drawing Figures

FIG. 3A
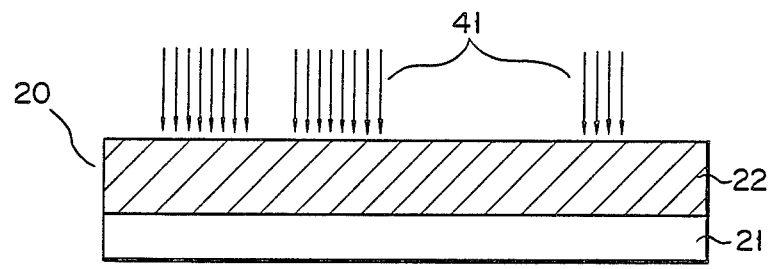
FIG. 3B
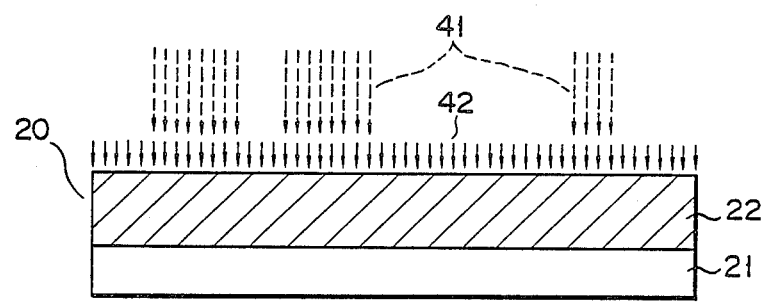
FIG. 4A
FIG. 4B
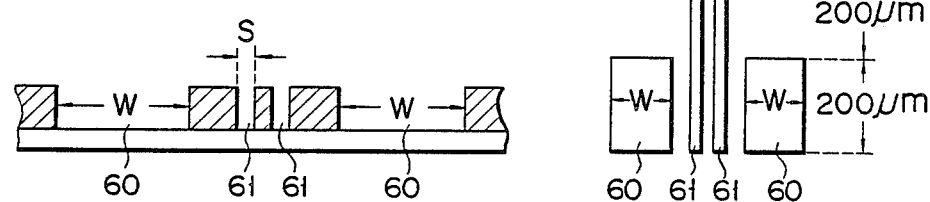

F I G. 6A
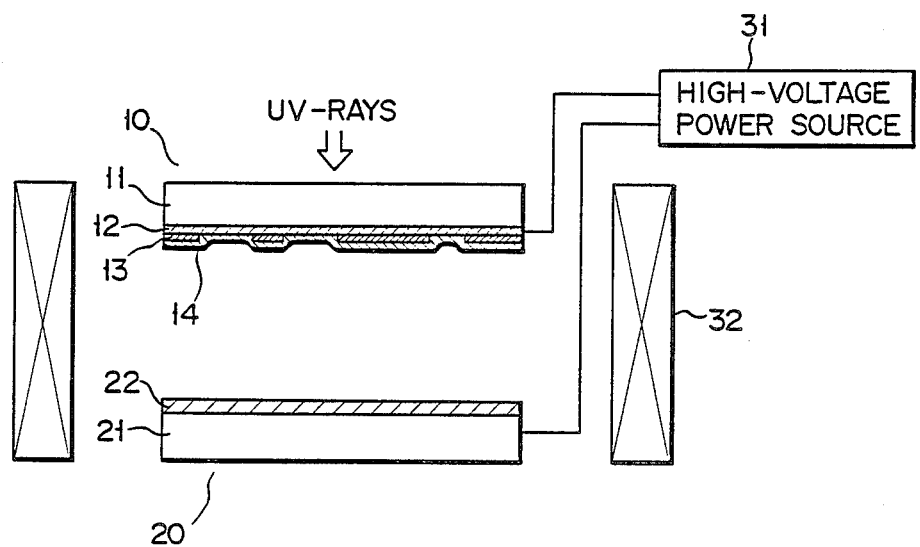
F I G. 6B
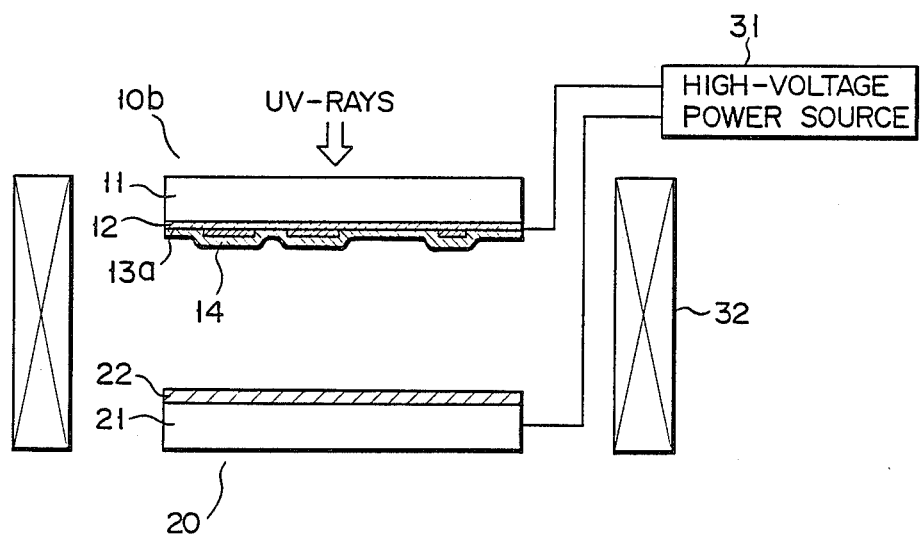

F I G. 11A
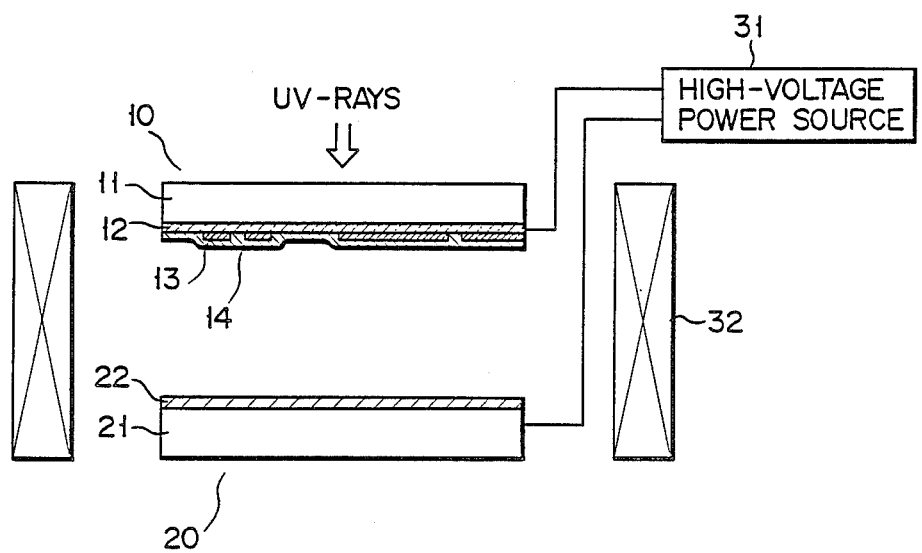
F I G. 11B
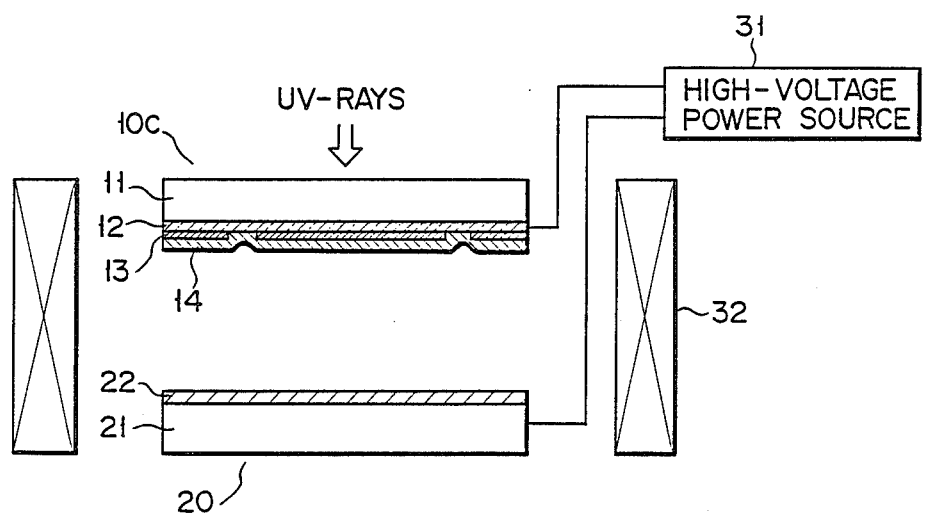

F I G. 12A
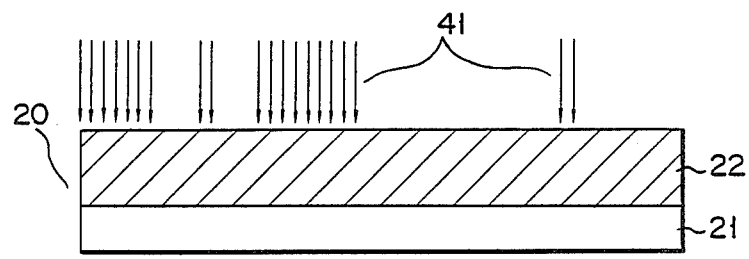
F I G. 12B
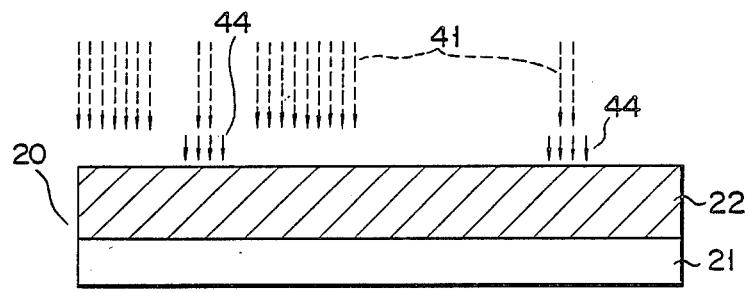
F I G. 13A          F I G. 13B
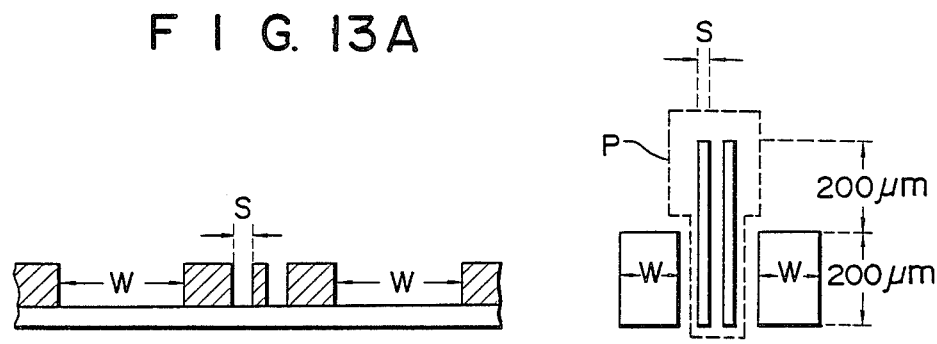

F I G. 23
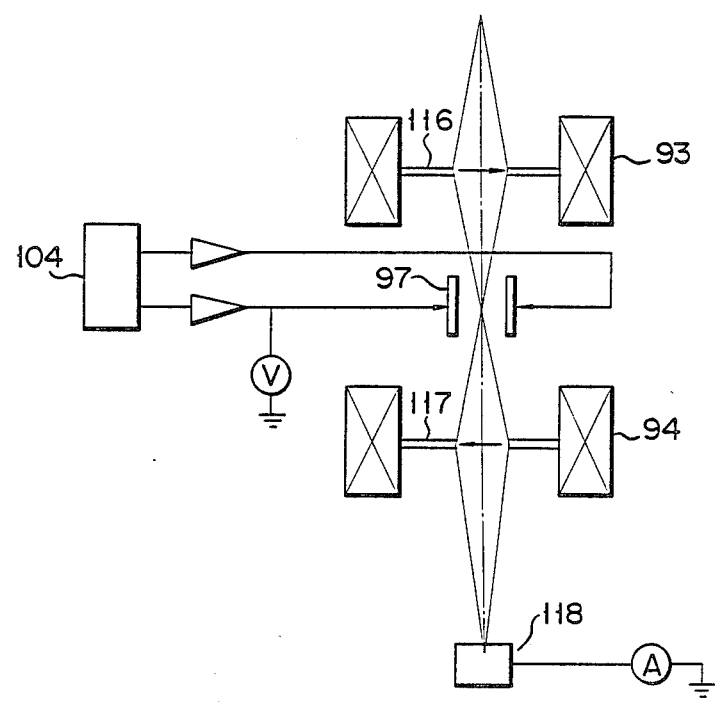
F I G. 24
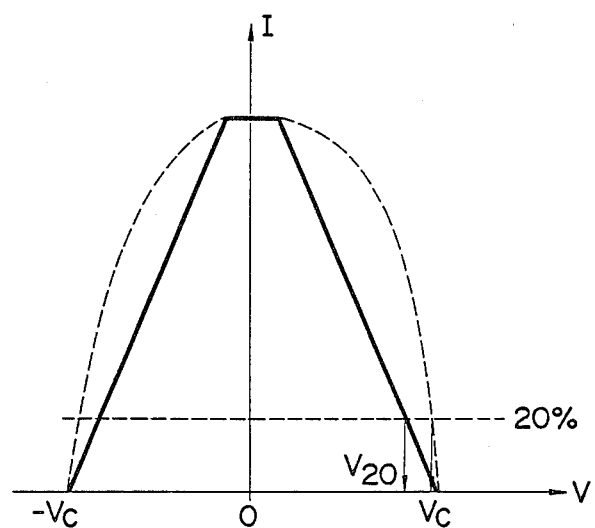

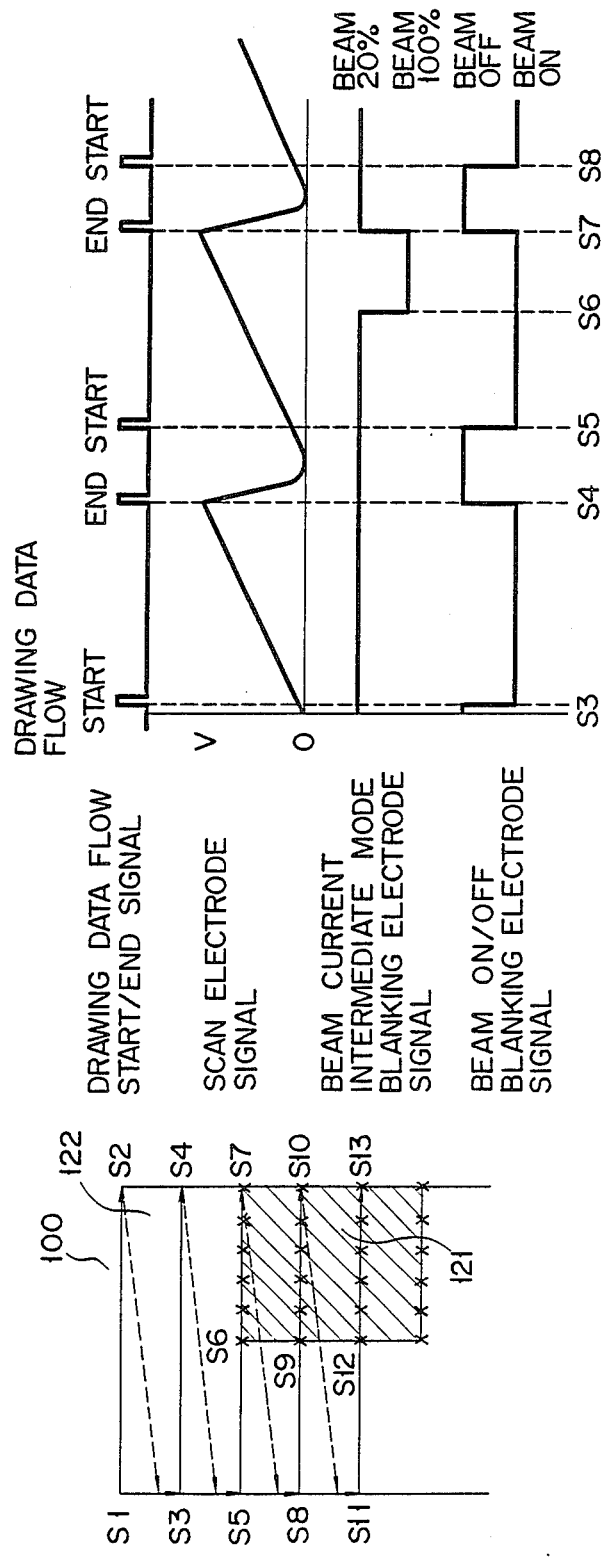

METHOD OF FORMING A FINE PATTERN WITH A CHARGED PARTICLE BEAM

This application is a continuation of application Ser. No. 778,795, filed on Sept. 23, 1985, now abandoned.

BACKGROUND OF THE INVENTION

1. Field of the Invention

The present invention relates to a method of forming a fine pattern with a charged-beam technique such as a charged-beam delineation, and, more particularly, to a method of forming a pattern wherein the proximity effect is reduced.

2. Discussion of Background

Recently, very fine patterns of LSI devices have been required. Devices of a 0.5 μm or even 0.25 μm dimension will be developed in the near future. It is difficult for a conventional optical stepper to manufacture such microdevices. Consequently, demand has arisen for new and improved lithographic techniques. Among these, electron beam lithography is most promising.

However, electron beam lithography has a disadvantage in that a pattern of 1 μm or less cannot be accurately formed due to scattering of the electron beam in a solid material, i.e., due to the promixity effect. For this reason, unceasing efforts have been made to prevent the proximity effect. For example, a multilayer resist technique, pattern size correction and beam dose correction (these corrections are performed by a main frame computer), high acceleration voltage application and the like have been proposed. However, none of these conventional techniques can satisfy the needs due to poor dimensional precision and a complicated process. It has been very difficult to date to decrease size errors to ±0.1 μm for dimensional allowances (±10%, i.e., 0.5 μm±0.05 μm or 0.25 μm±0.025 μm) in the patterns required for microdevices. Therefore, improved submicron electron beam lithography depends greatly on how pattern error, caused by the promixity effect, can be decreased.

SUMMARY OF THE INVENTION

It is an object of the present invention to provide a method of forming a fine pattern with a charged beam, wherein a pattern error caused by the proximity effect can be reduced by a simple process, and LSI microdevices can be accurately manufactured.

The present inventors made extensive studies as to how pattern errors caused by the proximity effect could be decreased. The present inventors found that when an auxiliary beam is irradiated at a low dose on a predetermined region of a wafer coated with resist before or after a beam of a normal dose required for normal electron beam projection or delineation is irradiated on the wafer, pattern errors can be greatly decreased. In this case, the auxiliary beam comprised one of a delineation beam and a projection exposure beam. The auxiliary beam is not limited to an electron beam, but can be extended to an ultraviolet ray, a far ultraviolet ray or an electromagnetic wave such as an X-ray. A charged beam such as an ion beam can also be used. The auxiliary exposure region may be an entire surface of the sample, a nonpattern region or a specific pattern region.

The present invention has been made based on the above findings. According to the present invention, there is provided a method of forming a fine pattern on a sample by using a charged beam, the method being exemplified by an electron beam projection method and a charged beam delineation method wherein before or after a beam is selectively irradiated at a predetermined dose D to expose a predetermined region to form an exposure pattern, a charged beam or an electromagnetic wave is irradiated, at a dose D1 smaller than the dose D, as an auxiliary beam to expose at least a nonpattern region around the exposure pattern on the sample.

According to the present invention, the patterning error caused by the proximity effect can be reduced with excellent effect. As a result, a dimensional allowance of ±10% was realized in the lower submicron lithography for the first time. Thus, the most disadvantageous drawback of the electron beam projection method or charged beam patterning method has been overcome, thereby providing the newest in improved lithography. The proximity effect can be decreased, and microdevices can be easily manufactured without complicating the process, thus providing great advantages in industrial application.

BRIEF DESCRIPTION OF THE DRAWINGS

FIG. 2A to FIG. 5 show a method according to a first embodiment of the present invention, in which FIGS. 2A and 2B, and FIGS. 3A and 3B are sectional views explaining the steps in forming the patterns, FIGS. 4A and 4B are views showing a pattern shape, and FIG. 5 is a graph showing a size error ΔS from a design pattern as a function of a large-area pattern width W;

FIG. 6A to FIG. 8 show a method according to a second embodiment of the present invention, in which FIGS. 6A and 6B, and FIGS. 7A and 7B are sectional views showing the pattern forming processes, and FIG. 8 is a graph showing a size error ΔS from a design pattern as a function of a large-area pattern width W;

FIGS. 9A to 10 show a method according to a third embodiment of the present invention, in which FIGS. 9A to 9C are sectional views showing the pattern formation process, and FIG. 10 is a graph showing a size error ΔS from a design pattern as a function of a large-area pattern width W;

FIGS. 11A to 13B show a method according to a fourth embodiment of the present invention, in which FIGS. 11A and 11B, and FIGS. 12A and 12B are sectional views showing the pattern forming processes, and FIGS. 13A and 13B show a pattern shape;

FIGS. 15 and 16 are views explaining the conventional drawback, in which FIG. 15 is a sectional view showing a conventional pattern forming process, and FIG. 16 is a graph showing a size error ΔS from a design pattern as a function of a large-area pattern width W;

FIGS. 18 to 21 are views explaining an electron beam delineation apparatus which can be used in the first embodiment, in which FIG. 18 is a schematic diagram thereof, FIG. 19 is a perspective view explaining the principle of raster scan delineation, FIG. 20 is a representation explaining pattern scanning and correction pattern scanning by the apparatus, and FIG. 21 is a timing chart explaining the relationship between delineation procedures and signals; and FIGS. 22 to 26 are views explaining an electron beam delineation apparatus which can be used in the second embodiment of the present invention, in which FIG. 22 is a schematic diagram thereof, FIG. 23 is a detailed diagram thereof, FIG. 24 is a graph showing the beam current as a function of a deflection voltage, FIG. 25 is a representation explaining delineation by the apparatus, and FIG. 26 is a timing chart explaining the relationship between the delineation procedures and the signals.

DETAILED DESCRIPTION OF THE PREFERRED EMBODIMENTS

Figure 1A:
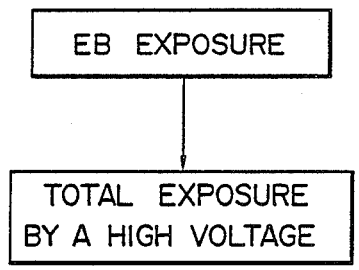
FIGS. 1A to 1D are, respectively, representations explaining four types of processes so as to clarify the basic principle of the present invention.
Figure 1B:
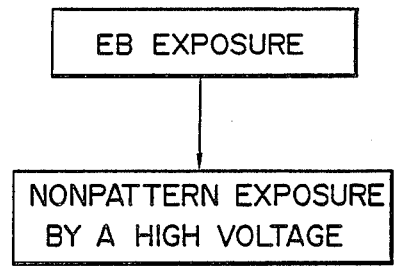
Figure 1C:
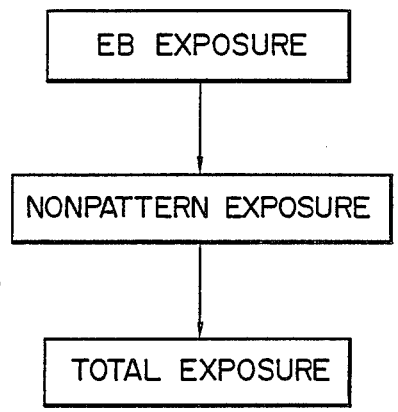
Figure 1D:
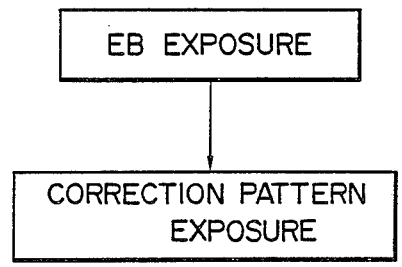

A method of forming a pattern with a charged beam is exemplified by four embodiments shown, respectively, in FIGS. 1A to 1D. As shown in FIG. 1A, according to a first embodiment, an electron beam is irradiated at a dose D0, that required for selectively forming a pattern, on a specific pattern region to form a main pattern. An electron beam or electromagnetic wave is irradiated at a dose D2, smaller than the dose D1 required for forming the main pattern, on the specific pattern region and the entire surface of the nonpattern region after an electron beam projection (to be referred to as an EB projection) or normal charged beam delineation (to be referred to as an EB delineation hereinafter) is performed. According to a second embodiment, as shown in FIG. 1B, the nonpattern region is selectively exposed after the EB projection or the EB delineation is performed. According to a third embodiment, as shown in FIG. 1C, the nonpattern region is selectively exposed and then the entire surface thereof is exposed after the EB projection or EB delineation is performed. According to a fourth embodiment, as shown in FIG. 1D, a correction pattern is selectively exposed after the EB projection or EB delineation is performed.

In the above embodiments, the auxiliary exposure can be performed before or after the EB projection or EB delineation is performed. Alternatively, the auxiliary exposure and the EB projection or EB delineation can be simultaneously performed. The auxiliary exposure can be performed such that the beam is scanned on the sample to perform delineation, or the beam is projected through a mask to selectively expose the sample (i.e., to transfer the pattern to the sample). In this case, an acceleration voltage is 30 keV or more so that and the molecular weight distribution along the direction of thickness of the pattern will not be changed. (An ion beam may be used for auxiliary exposure.)

The four embodiments of the present invention will be described in detail by way of examples. The acceleration voltage is, preferably, a high voltage of 30 keV or more. In practice, the acceleration voltage was 50 keV. In order to obtain a better effect, the acceleration voltage must be 40 keV or more.

EXAMPLE 1

This example depicts application of the method shown in FIG. 1A.

Figure 2A:
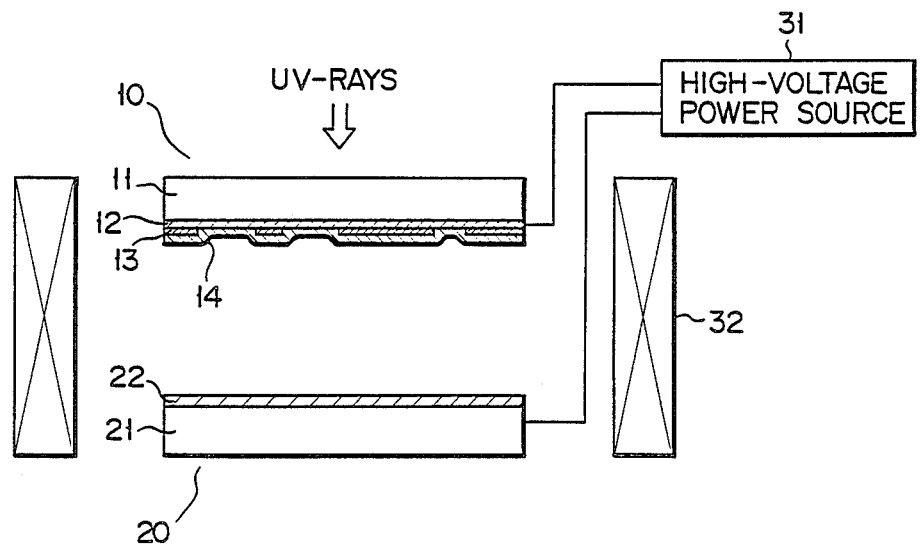

As shown in FIG. 2A, a photoelectric mask 10 for emitting an electron beam (photoelectron) in a desired pattern was located opposite to a sample 20 subjected to electron beam projection. An electric field was applied by a DC high-voltage power supply 31 between the mask 10 and the sample 20, and a magnetic field was applied by a focusing magnet 32. In this state, an ultraviolet ray irradiated the mask to perform equal-size exposure in the same manner as for normal electron beam projection. As shown in FIG. 3A, an electron beam 41, at a dose D0 required for selectively forming a pattern, was irradiated on the sample 20 to expose a specific pattern region (EB projection), thereby forming an exposure pattern.

The mask 10 was of a known type, that is, the mask 10 comprised a transparent substrate 11 such as a quartz substrate for transmitting an ultraviolet ray, a transparent conductive film 12 coated on the lower surface of the substrate 11, a mask pattern 13 of a thin film (e.g., a chromium film) formed on the lower surface of the film 12 so as to shield the ultraviolet ray, and a photoconductive surface 14 of CsI or the like coated on the lower surfaces of the film 12 and the pattern 13 so as to emit photoelectrons upon reception of the ultraviolet ray. The sample 20 had a positive resist film 22 of PMMA (polymethylmethacrylate) on a silicon wafer 21. The power supply 31 was connected between the film 12 and the substrate 21 to vertically apply an electric field between the mask 10 and the sample 20, while the magnet 32 applied a focusing magnetic field in the same direction as that of the electric field. The pattern projection was performed by an electron beam projection apparatus (to be described later).

Figure 2B:
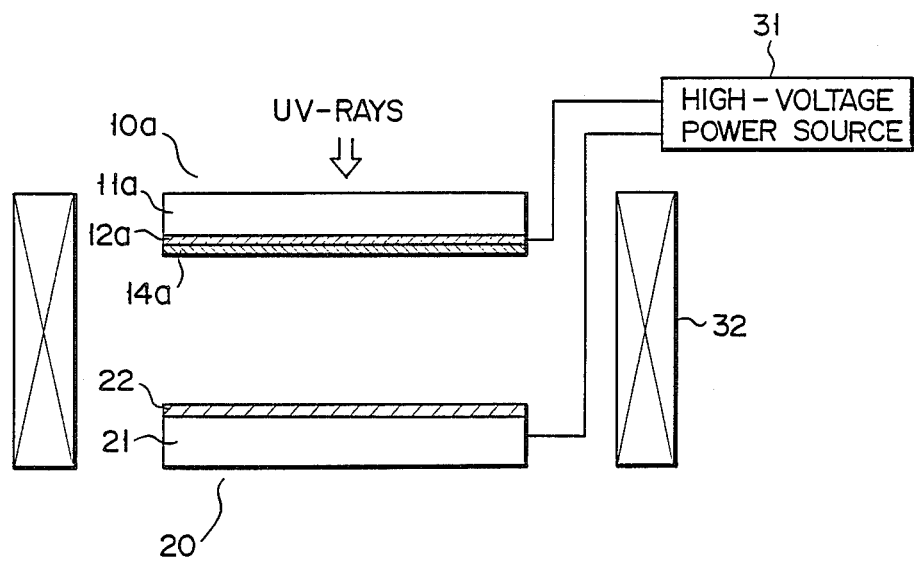

As shown in FIG. 2B, a full-surface exposure photoelectric mask 10a was used in place of the mask 10, and the electron beam projection was performed. The mask 10a comprised a transparent electrode film 12a formed on the lower surface of a transparent substrate 11a, and a photoconductive surface 14 formed on the lower surface of the film 12a. The mask 10a was of the same material and produced by the same manufacturing process as the mask 10, except that the mask pattern was omitted. As shown in FIG. 3B, an electron beam 42 of a dose D1, which was 20% of the dose D0, was irradiated on the entire surface of the pattern and nonpattern regions of the sample 20 (entire exposure).

As shown in FIGS. 4A and 4B, the pattern had two large-diameter patterns 60 and two 0.5 $\mu$m line patterns 61 located between the patterns 60. The height of the pattern 60 was 20 $\mu$m, and widths of the patterns 60 differed by 5 $\mu$m. The length of the 0.5 $\mu$m line patterns was 400 $\mu$m.

Figure 5:
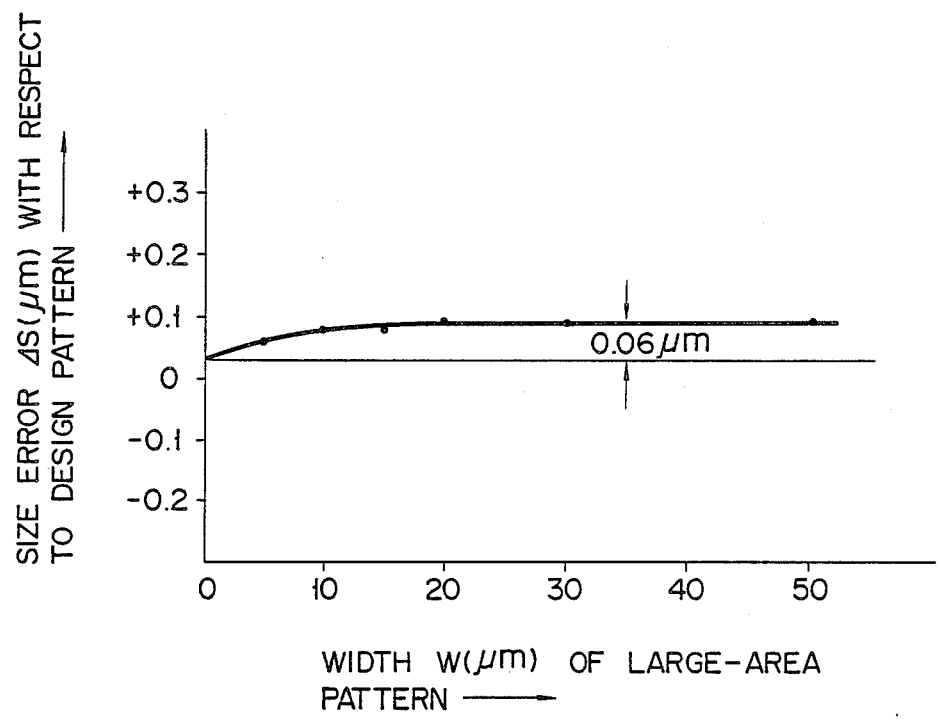

A variation in size error of the projected 0.5 $\mu$m line fell within 0.06 $\mu$m, as shown in FIG. 5. In other words, the variation of the pattern error fell within ±10% (±0.03 $\mu$m) of the 0.5 $\mu$m pattern. Referring to FIG. 5, the large-area pattern width was plotted along the abscissa, and the size error $\Delta S$, with respect to the 0.5 $\mu$m line design pattern, was plotted along the ordinate.

Figure 15:
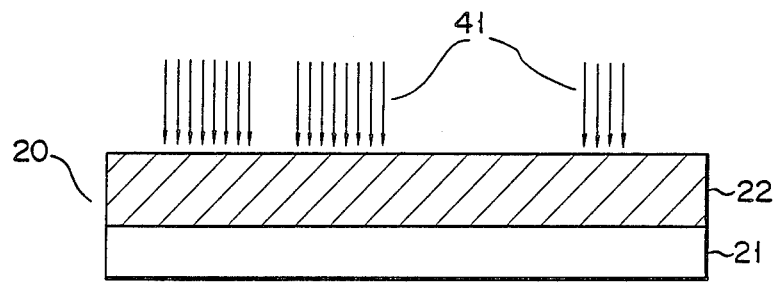
Figure 16:
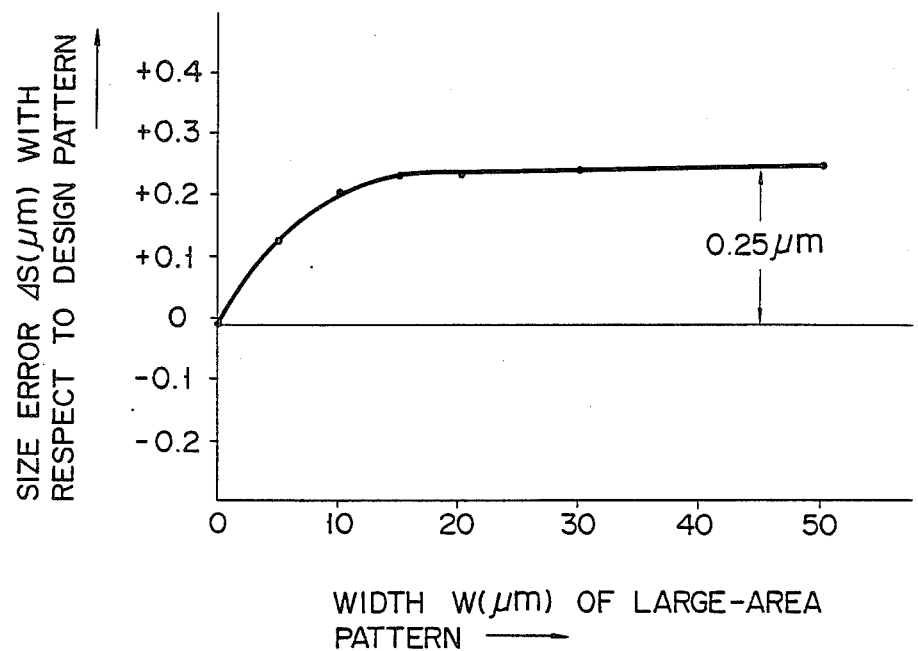

As shown in FIG. 15, according to the conventional method, when the pattern is selectively projected at a dose D0, the variation of the pattern size is 0.25 $\mu$m, as shown in FIG. 16. The allowable range of ±0.05 $\mu$m, as the variation allowance of ±10% for the 0.5 $\mu$m pattern, can not be satisfied.

According to Example 1, variations of the pattern size caused by the proximity effect, and especially variations of the micropatterns can be greatly reduced to fall within the range of 0.06 $\mu$m (±0.03 $\mu$m), as compared with the conventional variations of 0.25 $\mu$m. For this reason, the method of Example 1 can be used for forming conventional submicron deivces and provides great advantages in industrial applications.

In Example 1, the auxiliary exposure (entire exposure) is exemplified by electron beam projection exposure. However, an electron beam of a dose D2 (within 50% of D1), smaller than the dose D0 required for selectively forming a pattern on the sample, may be irradiated on the entire surface of the sample. The auxiliary exposure may be performed with an ultraviolet ray, a far ultraviolet ray or an electromagnetic wave such as an X-ray, instead of the electron beam. In this case, the entire surface of the sample 10 is exposed by a dose D2 (preferably within 50% of D1), smaller than the dose D1 for selectively forming the pattern with the electromagnetic wave. The present inventors have confirmed that the same effect as described above can be obtained by electromagnetic wave irradiation. (An ion beam can be used in place of the electron beam.)

Test results are shown in Table 1 for varied auxiliary exposure conditions. In this case, the dose of the EB transfer electron beam was 60 μc/cm². (No auxiliary exposure was performed for Sample 1 (Prior art).) For Sample 2, the dose D2 was 20% of the dose D0, and an electron beam was used. For Sample 3, the dose D2 was 20% of the dose D0, and X-rays were used. For Sample 4, the dose D2 was 20% of the dose D0, and deep ultraviolet rays were used. In Table 1, the remaining resist thickness indicates a thickness of the resultant resist pattern, and the side wall angle indicates an angle formed by the pattern and the wafer.

TABLE 1

|  | Sample 1 | Sample 2 | Sample 3 | Sample 4 |
| --- | --- | --- | --- | --- |
| Size variation | ±0.125 μm (0.25 μm) | ±0.06 μm (0.12 μm) | ±0.045 μm (0.09 μm) | ±0.06 μm (0.12 μm) |
| Remaining resist thickness | 4800Å–8300Å | 7700Å–9200Å | 7000Å–8800Å | 5900Å–7900Å |
| Side wall angle | 78°–89° | 85°–90° | 84°–89° | 84°–89° |

As is apparent from Table 1, the same effect as in the electron beam for auxiliary exposure can be obtained by auxiliary exposure employing other types of radiation.

EXAMPLE 2

Example 2 exemplifies the method of FIG. 1B.

Figure 7A:
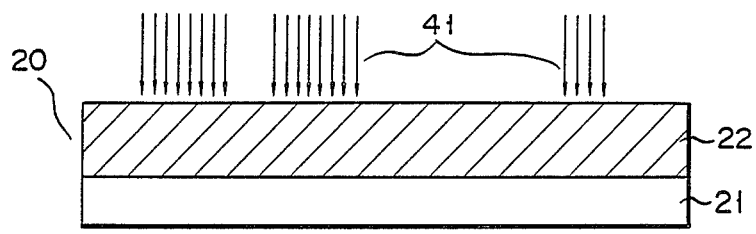
Figure 7B:
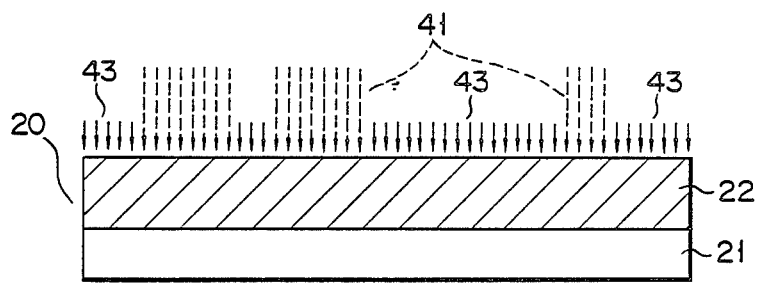

As shown in FIG. 6B, EB projection exposure was performed in the same manner as in Example 1. As shown in FIG. 7A, an electron beam 41 was irradiated to form a desired pattern (EB projection). Subsequently, as shown in FIG. 6B, a mask 10b having a mask pattern 13a opposite to that of the mask 10 was used in place of the mask 10a, and EB projection/exposure was performed. As shown in FIG. 7B, an electron beam 43 of a dose D3, which was 20% of the dose D0 for selectively forming the main pattern, was selectively irradiated (selective pattern exposure). In this case, the resultant pattern was the same as that of FIGS. 4A and 4B.

Figure 8:
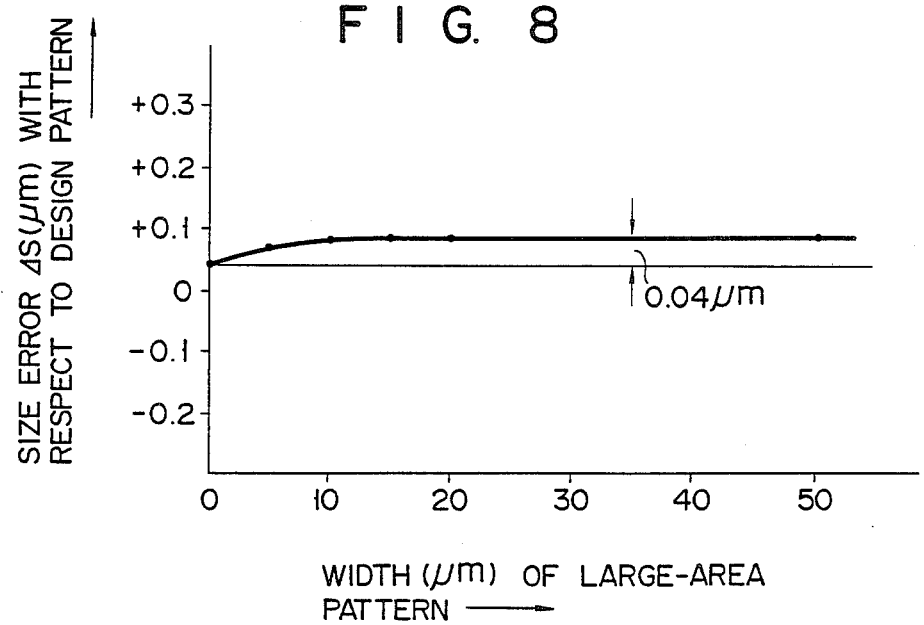

The size variation of the projected pattern, especially the size variation for the 0.5 μm line, was 0.04 μm, as shown in FIG. 8. In other words, the pattern variation fell within ±10% (±0.02 μm) of the 0.5 μm pattern. The same effect as in Example 1 was obtained.

In Example 2, electron beam delineation or electromagnetic wave exposure can be performed for auxiliary exposure (nonpattern exposure). Furthermore, the order of the EB projection and the nonpattern exposure is not limited to that described above.

In Example 2, the pattern exposure and the nonpattern exposure are performed separately. However, by properly selecting the material of the mask pattern 13a, the pattern exposure and the nonpattern exposure can be simultaneously performed. More particularly, a material for the pattern 13a must be one transparent to ultraviolet rays, and the ultraviolet transmittance of the pattern 13a needs be set to about 20%. By using such a photoelectric mask, the EB projection and the nonpattern exposure can be performed simultaneously in the process shown in FIG. 6A.

EXAMPLE 3

Example 3 exemplifies the method of FIG. 1C.

Figure 9A:
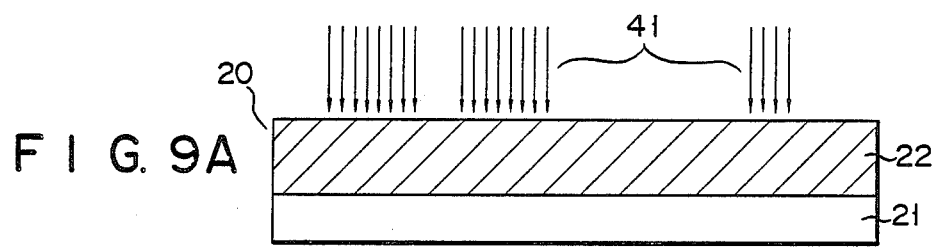
Figure 9B:
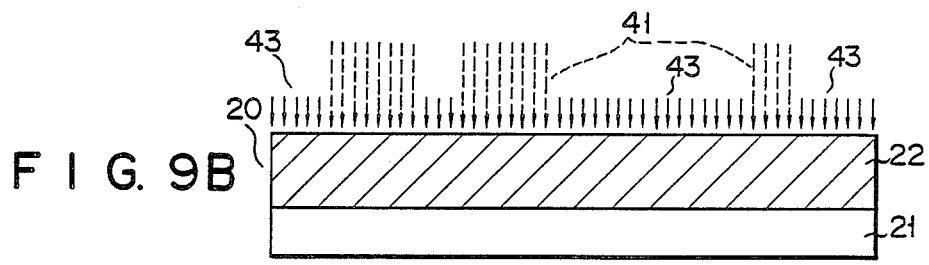
Figure 9C:
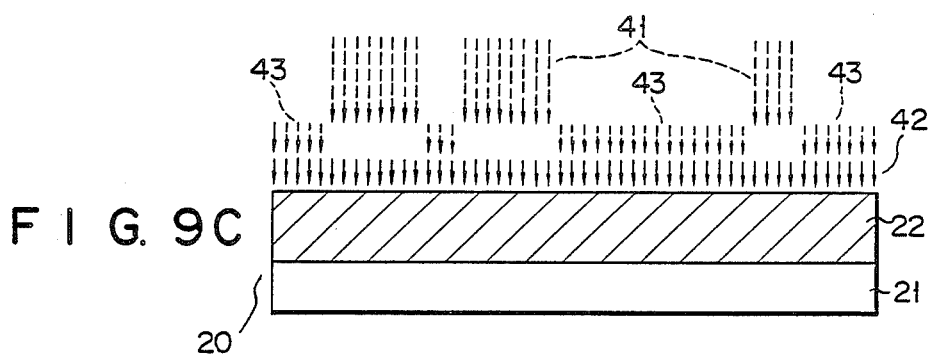

As shown in FIGS. 6A and 6B, the EB projection and the nonpattern exposure was performed. As shown in FIG. 2B, the entire surface exposure was performed. More particularly, as shown in FIG. 9A, an electron beam 41 was used to project a desired pattern (EB projection) in the same manner as in Example 1. As shown in FIG. 9B, an electron beam 43 of a dose D3, which was 20% of the dose D0, was selectively irradiated on the sample (nonpattern exposure). Subsequently, as shown in FIG. 9C, an electron beam 42 of the dose D0 was scanned on the entire surface of the sample 20 (entire surface exposure). In this case, the resultant pattern was the same as that of Example 1, as shown in FIGS. 4A and 4B.

Figure 10:
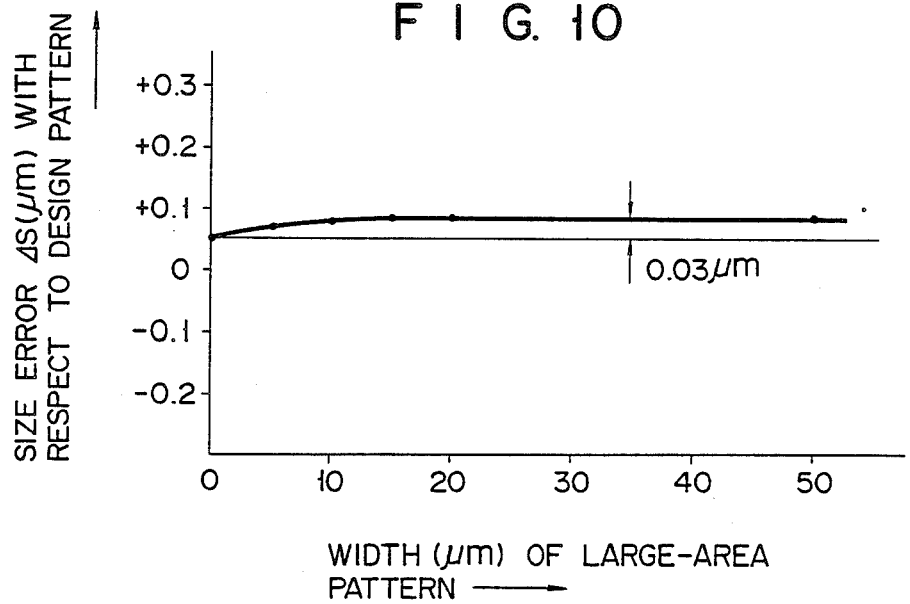

The pattern variation, especially the size variation for the 0.5 μm line, was 0.03 μm, as shown in FIG. 10. In other words, the pattern variation fell within ±10% of the 0.25 μm pattern.

In Example 3, electron beam delineation and electromagnetic wave exposure can be used as the auxiliary exposure. The order of the EB projection, the nonpattern exposure and the entire surface exposure can be changed as needed.

EXAMPLE 4

Example 4 exemplifies the method of FIG. 1D.

As shown in FIG. 11A, the mask 10 was used to perform the normal EB projection. Subsequently, the electron beam projection was performed by using a mask 10C having a correction pattern as shown in FIG. 11B. As shown in FIG. 12A, projection exposure (EB projection) was performed with an electron beam 41 to project a desired pattern. As shown in FIG. 12B, an electron beam 44 was selectively irradiated at a dose D4, which was 20% of the dose D0, on the correction pattern region of the sample (correction pattern exposure). In this case, the projection pattern was the same as that of Example 1, as shown in FIGS. 13A and 13B. The correction pattern region P was a specific pattern region (i.e., especially the micropattern and its peripheral region) of the pattern region.

The size error ΔS of the resultant pattern, with respect to the design value, was substantially the same as that shown in FIG. 8. The pattern variation, especially the size variation for the 0.5 μm line, was 0.04 μm in the same manner as in Example 2. In other words, the pattern variation fell within ±10% (±0.02 μm) of the 0.5 pattern.

In Example 4, electron beam delineation and electromagnetic wave exposure can be used as the auxiliary exposure. The order of the EB projection and the correction pattern exposure is not limited to that described above. When the electron beam delineation is performed on the basis of the correction pattern data, electron beam projection and electromagnetic wave exposure are performed by using a mask having the correction pattern.

Figure 14:
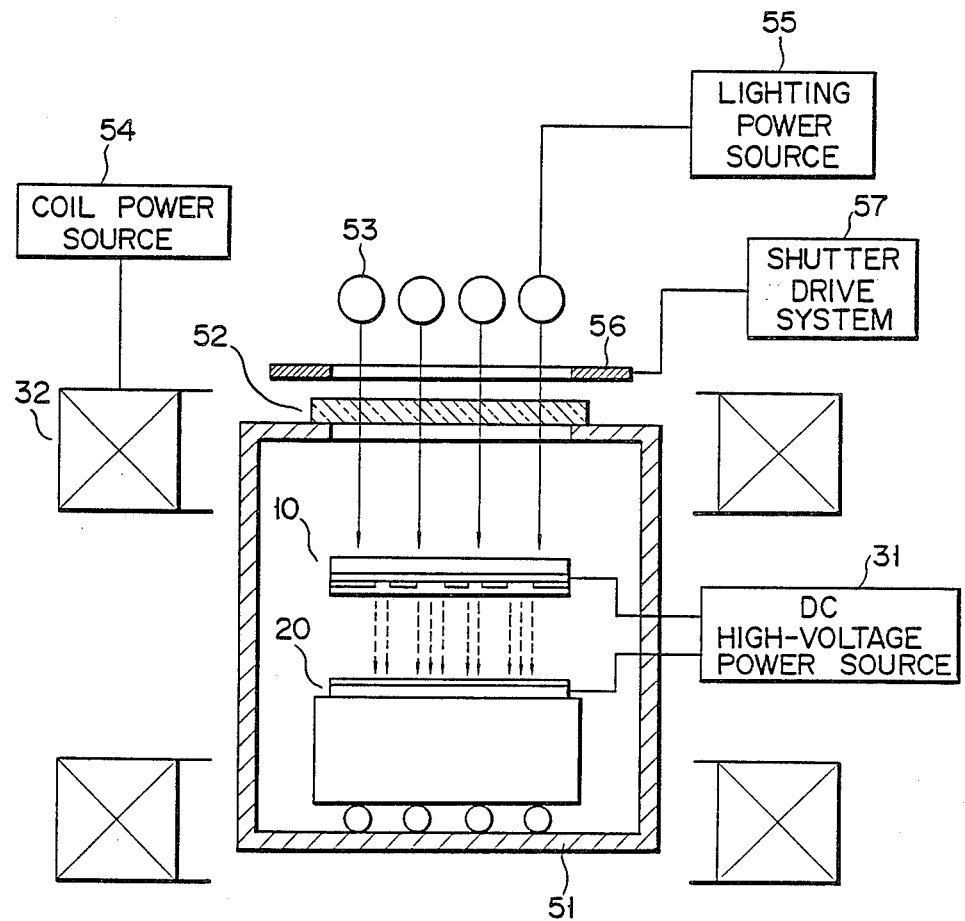
FIG. 14 is a schematic diagram showing an electron beam projection apparatus used in the methods of the embodiments of the present invention.

An arrangement of the electron beam projection apparatus used in the examples described above will be described in detail. FIG. 14 is a schematic diagram showing the apparatus. A sample chamber located in the interior of a vacuum vessel 51 is evacuated to a vacuum of $10^{-6}$ torr. The mask 10 is placed at a predetermined position in the vacuum chamber 51. The sample 20 is located opposite to the mask 10. They are spaced apart by about 10 mm. A light-transmitting window is formed in the upper wall of the vessel 51. A transparent plate 52 is mounted on the upper wall to close the window. An ultraviolet ray is introduced from a light source 53 to the vessel 51 through the plate 52 so that the upper surface of the mask 10 is illuminated.

A focusing magnet 32 such as a Helmholtz coil is located around the vessel 51. A DC current flows from a power source 54 to the magnet 32 to vertically apply a magnetic field between the mask 10 and the sample 20. At the same time, a high voltage is also applied from a power source 31 between the mask 10 and the sample 20. The direction of the magnetic field is the same as that of the electric field. Reference numeral 55 denotes a power source for the light source 53; 56, a shutter; and 57, a shutter drive system.

With this arrangement, an ultraviolet ray emitted from the light source 53 irradiates the upper surface of the mask 10 through the plate 52 to generate an electron beam (photoelectron) from the photoconductive surface of the mask 10. The electron beam is focused by the magnetic and electric fields. The focused beam propagates downward to expose the resist in accordance with the mask pattern, thereby completing the pattern projection.

In Examples 1 to 4, the patterns are formed via the electron beam projection operation. However, a charged beam may be used to form the same pattern as described above.

A pattern will be formed by projection as follows.

EXAMPLE 5

Example 5 exemplifies the method of FIG. 1B. In this case, a variable beam is used to delineate a pattern.

Figure 17:
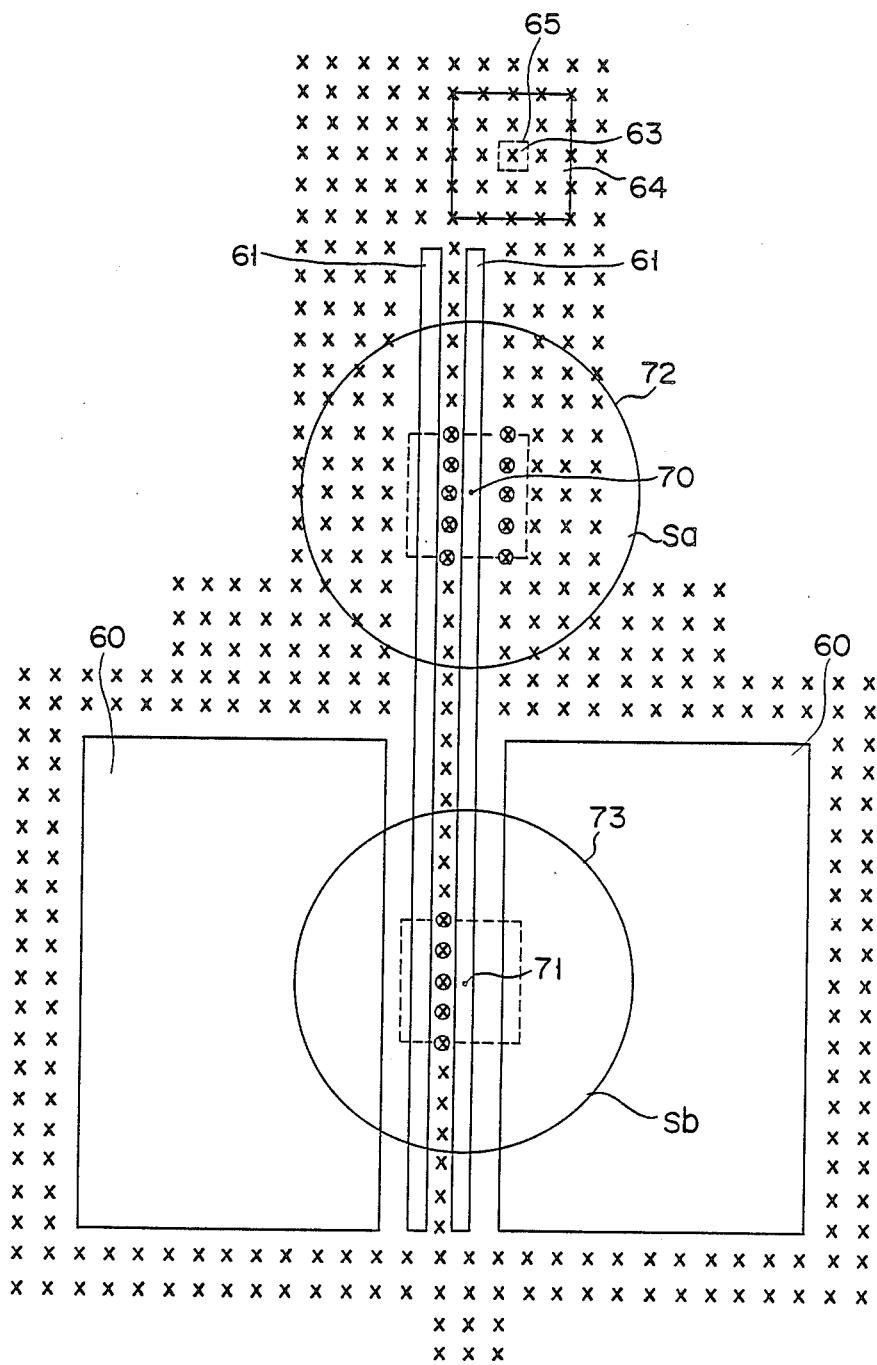
FIG. 17 is a representation showing a pattern shape and address points so as to explain a method according to a fifth embodiment of the present invention.

A rectangular beam was irradiated at a dose D1 on a pattern region so as to perform EB delineation. Thereafter, a rectangular beam of a larger size than the beam of the dose D1 was irradiated on a nonpattern region at a dose D2 to perform nonpattern exposure. The drawn pattern was the same as that of Example 1, as illustrated in the enlarged view of FIG. 17. Reference numerals 60 denote two large-area patterns; and 61, two 0.5 μm lines extending between the patterns 60. Cross marks represent beam irradiation points (i.e., address points) in the nonpattern region. Reference numeral 64 denotes a rectangular beam irradiated onto the address points 63, the size of the beam 64 being larger than an address area (i.e., a data area) 65. In this example, the size of the beam 64 was 16 times the region 65. A beam current IN of the beam was defined as follows:

$$I_N = A J_{43} \quad (1)$$

$$J_{43} = 0.3 J_P \quad (2)$$

Therefore, $$I_N = 0.3 A J_P \quad (3)$$

where A is the area of the region 65, $J_{43}$ is the irradiation current density of the area 65, and $J_P$ is the irradiation current density in each of the regions 60 and 61. A current density $J_{44}$ of the beam 64 is $$J_{44} = J_{43}/16 \approx J_P/50 \quad (4)$$

The current density $J_{44}$ of the beam 64 is about 1/50 of the current density $J_P$ of the pattern region. A dose $D_N$ of the point 63 is influenced by doses of 16 address points surrounding the point 63, so that $$D_N = 0.3 D_P \quad (5)$$

where $D_P$ is the dose of the pattern region.

Exposures $E_{50}$ and $E_{51}$ of a point 70 in an independent line, and a point 71 in a line surrounded by the large pattern are considered:

$$E_{50} = D_P + n_{50} A J_{44} + \int_{Sa} D_N f(r) dr \quad (6)$$

$$E_{51} = D_P + n_{51} A J_{64} + \int_{Sb} D_N f(r) dr \quad (7)$$

In this case, the number of address points contributed to the point 70 is 10, and the number of address points contributed to the point 71 is 5, so that $n_{50}$ and $n_{51}$ are 10 and 5, respectively. Sa and Sb are regions contributed for back scattering electrons around the points 70 and 71, respectively. The regions Sa and Sb are represented by circles 72 and 73, respectively, f(r) being the density distribution of the back scattering electrons.

A difference between $E_{51}$ and $E_{50}$ is $$\Delta E = E_{51} - E_{50} \quad (8)$$
$$= \int_{Sb} D_P f(r) dr - \int_{Sa} D_N f(r) dr - (n_{51} - n_{50}) A J_{44}$$

When normal drawing is performed, the difference is given as follows:

$$\Delta E_0 = \int_{Sb} D_P f(r) dr \quad (9)$$

when the rectangular beams do not overlap in the nonpattern area, $$\Delta E_1 = \int_{Sb} D_P f(r) dr - \int_{Sa} D_N f(r) dr \quad (10)$$

When equations (8), (9) and (10) are compared, the following condition is derived:

$$\Delta E < \Delta E_0, \Delta E_1$$

A size variation of the drawn pattern, especially for the 0.5 μm line, was the same as that of Example 1, and was 0.06 μm or less. In other words, the pattern size variation fell within ±10% (±0.03 μm) of the 0.5 μm pattern.

The exposure of the pattern region was 60 μc/cm², and the exposure $D_N$ was 18 μc/cm².

An electron beam delineation apparatus used in the above embodiment will be described.

Figure 18:
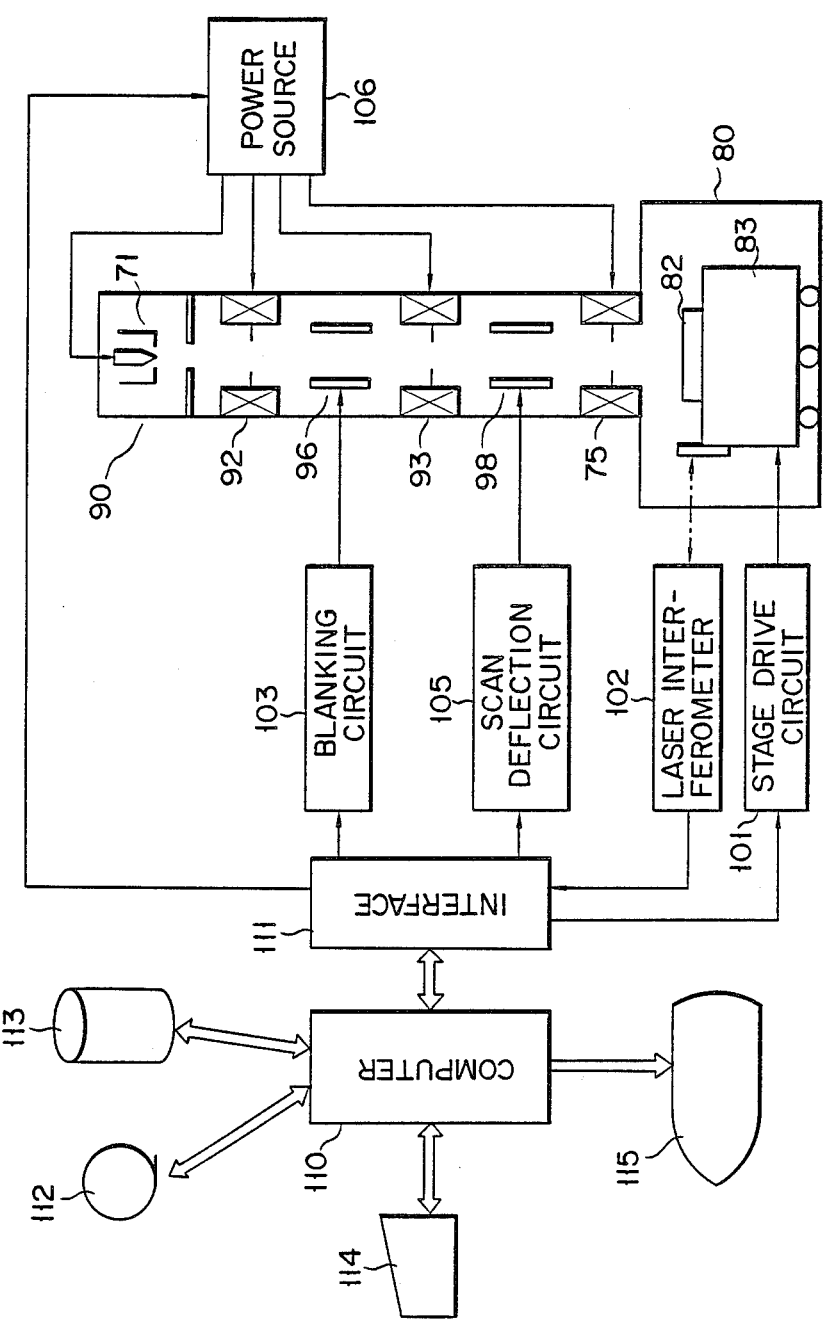

FIG. 18 schematically shows an electron beam delineation apparatus of a raster scan system which can be used in Example 1. Reference numeral 80 denotes a sample chamber. A sample stage 83 having a sample 82 thereon, and subjected to electron beam delineation is housed in the chamber 80. The stage 83 is moved by a stage drive circuit 101 along the X direction (i.e., right and left direction in FIG. 18) and the Y direction (i.e., the upper and lower surface direction in FIG. 18). The position of the stage 83 is monitored by a laser interferometer 102. An electronic optical barrel 90, including an electron gun 91, lenses 92, 93 and 95 and deflectors 96 and 98, is arranged in the upper portion of the chamber 80. The deflector 96 constitutes a blanking deflector for blanking the beam. A blanking voltage is applied by a blanking circuit 103 to the deflector 96. Unlike in the conventional raster scan type electron beam drawing apparatus, the circuit 103 eliminates beam blanking for a predetermined period of time during the flyback period of raster scanning (to be described later). The deflector 98 constitutes a scan deflector for scanning the beam above the sample 82 along one direction (i.e., the X direction). A deflection voltage is supplied by a scan deflection circuit 105 to the deflector 98.

Reference numeral 106 denotes a power source for the electron gun 91 and the lenses 92, 93 and 95; 110, a computer; 111, an interface; 112, a magnetic tape I/O device; 113, a magnetic disk drive; 114, an I/O terminal; and 115, a graphic display.

Figure 19:
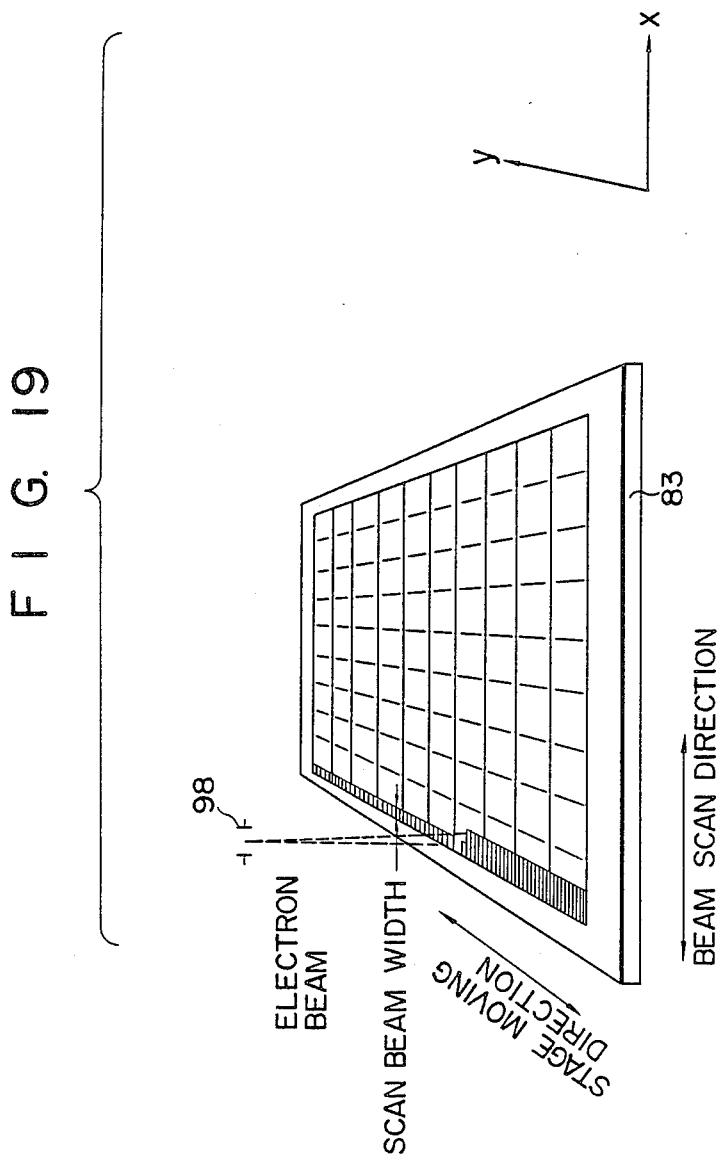

In the electron beam delineation apparatus having the arrangement described above, in principle, the sample 82 (i.e., the stage 83 having the sample 82 thereon) is continuously moved along the Y direction while the electron beam is scanned along the X direction, as shown in FIG. 19, thereby delineating a desired pattern by raster scanning. This operation is the same as a known electron beam delineation apparatus. Unlike in the conventional apparatus, however, the main feature of the apparatus of the present invention is that beam blanking for a predetermined period of time within the flyback period of raster scanning is eliminated to entirely correct the sample 82 within the flyback period.

Figure 20:
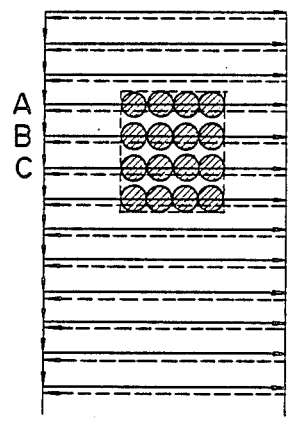
Figure 21:
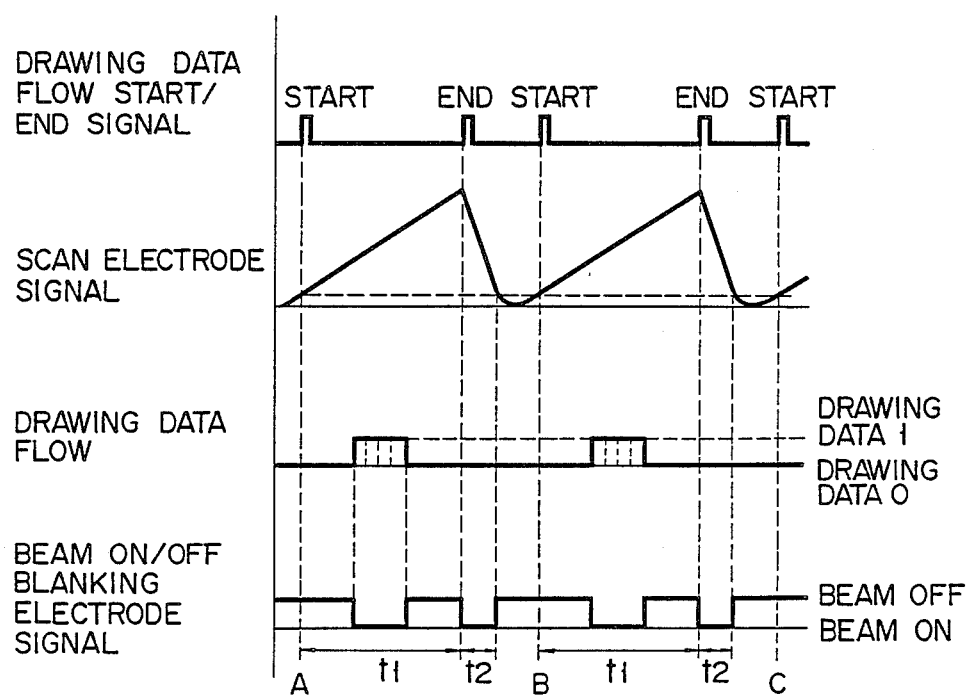

Delineation scan (EB delineation) and correction delineation scan (entire exposure) are performed by the apparatus described above with reference to FIGS. 20 and 21. FIG. 20 shows the case wherein pattern delineation and correction delineation are performed by raster scanning. Delineation scanning is represented by the solid arrows to delineate a pattern. Dotted arrows having a direction opposite to the solid arrows (although these arrows overlap each other in practice, they are deviated for illustrative convenience) represent a correction delineation scan performed within the flyback period. The hatched portion represents a desired pattern region. FIG. 21 is a timing chart explaining the delineation procedures. The respective signals between A and B (left half of the drawing) are used when the pattern region is included during delineation scan, while the signals between B and C (right half) are used when the pattern region is not included during delineation scan. For those signals, the time t1 represents a delineation scan time, and time t2 represents a correction delineation scan time. Delineation scan is performed for the time t1 at a predetermined beam current corresponding to the dose D1, that required for forming a pattern. However, in order to uniformly perform correction delineation at the dose D2, which is about 20% of the dose D1, the time t2 is set at 20% of the time t1. However, the time t2 can be arbitrarily determined in accordance with the desired size accuracy.

Figure 22:
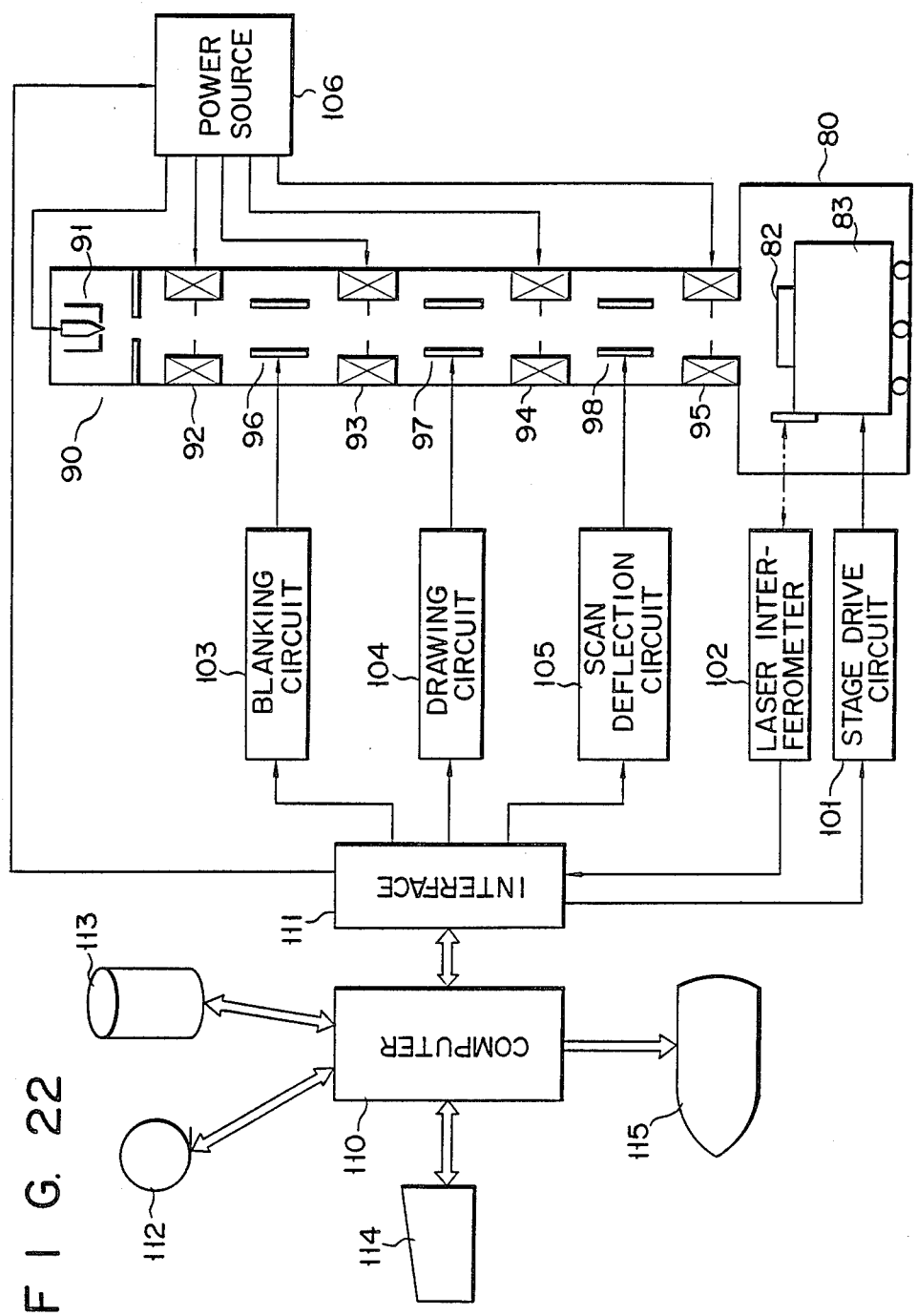

FIG. 22 schematically shows an electron beam delineation apparatus of a raster scan system which can be used in Example 2. The same reference numerals in FIG. 22 denote the same parts as in FIG. 18, and a detailed description thereof will be omitted. The apparatus of FIG. 22 is substantially the same as that of FIG. 18 except that a lens 94, an intermediate mode deflector 97 and a delineation circuit 104 are arranged in the former. The deflector 97 sets the beam current in the intermediate mode and receives a deflection voltage from the circuit 104. Unlike in the conventional delineation apparatus, ON/OFF control of the beam can be provided, and the nonpattern region delineated with an intermediate mode beam current (to be described later).

A means for setting the beam current in the intermediate mode will be described with reference to FIGS. 23 and 24. FIG. 23 shows the main part of the electron beam delineation apparatus of FIG. 22, the same reference numerals in FIG. 23 denoting the same parts as in FIG. 22. Reference numerals 116 and 117 denote apertures, and 118, a Faraday cup. When a predetermined intermediate mode reflection voltage is applied to the deflector 97, and a beam current passing through the lens 94 is measured by the cup 118, the electrical characteristics shown in FIG. 24 are obtained. Referring to FIG. 24, the solid lines represent the result when the rectangular aperture 116 into on the rectangular aperture 117. In this case, the beam current is moderately changed as compared with the voltage applied to the deflector 97. Broken lines in FIG. 24 show a case wherre a circular aperture is not focused on a circular aperture. In this case, when a voltage applied to the deflector 97 reaches a predetermined electrode voltage, the beam current is greatly decreased. In this apparatus, the nonpattern region is exposed by the dose D2, which is 20% of the dose D1 required for forming a pattern. An electrode voltage V, corresponding to the dose, is obtained, as is apparent from FIG. 24. In the practical apparatus, the cup 118 for measuring the beam current is mounted on the stage 83.

A delineation method using the apparatus described above will be described with reference to FIGS. 25 and 26. FIG. 25 shows a state where a pattern is delineated by raster scanning. Reference numeral 120 denotes a stripe shown in FIG. 19; 121, a pattern region (i.e., a hatched region); and 122, a nonpattern region. The electron beam is scanned in the order of S1 to S2, S3 to S4, S5 to S7 through S6, S8 to S10 through S9, and S11 to S13 through S12. The dotted lines S2 to S3, S4 to S5, S7 to S8 and S10 to S11 show the flyback or electron beam waiting period. During this period, the electron beam is set in the OFF mode. The dose D1 is set for the pattern region 121, and the dose D2, which is 20% of the dose D0, is set for the nonpattern region 122.

FIG. 26 is a timing chart explaining the relationship between the delineation procedures and the signal timings. When the region 122 is scanned with the beam (S3 to S4 and S5 to S6), the beam current is set at 20% (i.e., the intermediate mode) of the ON mode. However, when the region 121 is scanned (S6 to S7), the beam is set in the beam ON mode. During the flyback period (S4 to S5 and S7 to S8) of the electron beam, the beam is set in the beam OFF mode.

In practice, LSI pattern data is read out from the device 112, fetched by the CPU, and converted to an EB format. The converted pattern is stored in the drive 113. The dose D1 for irradiating the nonpattern region 122 varies in accordance with the minimum pattern size and the acceleration voltage. An optimal dose D1 is entered at the terminal 114 to determine a voltage for application to the deflector 97, thereby adjusting the circuit 104. When delineation starts, the delineation data is transferred to the deflector 97 to delineate the region 121 at the dose D1, and the region 122 at the dose D2. During the beam flyback period, the beam waiting period, or before delineation is started, the blanking voltage is applied to the deflector 96 and set in the OFF mode.

The method of the present invention is not limited to the embodiments described above. For example, the dose D2 of auxiliary beam irradiation (exposure) is not limited to 20% of the dose D1 required for selectively forming a pattern. On the contrary, the dose D2 can quite properly be established at any percentage less than the dose D1, but, preferably, within 50% of the dose D1. Similarly, the beam size for auxiliary exposure before EB delineation is not limited to any specific value, but should, preferably, be larger than the beam size during EB delneation. For EB projection, a reduction exposure as well as an equal-size exposure can be performed. Furthermore, the order of the EB projection or EB delineation and the auxiliary exposure need not be determined. The present invention can also be applied to a resist excluding the PMMA.

What is claimed is:

1. A method of forming a fine pattern with a charged beam, comprising the steps of:
    performing a first irradiation of a predetermined region of a sample with a charged beam to form an exposed pattern on the sample; and
    performing a second irradiation of a region around the pattern with either of a charged beam or an electromagnetic wave, and at a dose smaller than the dose for forming the exposure pattern, to perform an auxiliary exposure, the auxiliary exposure being such that a molecular amount distribution remains substantially unchanged along the direction of thickness of said region around the pattern of the sample wherein the step of performing the auxiliary exposure occurs at a voltage of not less than 30 keV.

2. A method according to claim 1, wherein the step of performing the auxiliary exposure is performed at a dose which is less than 50% of the dose for forming the exposure pattern.

3. A method according to claim 1, wherein the step of forming the exposure pattern comprises the step of irradiating a photoelectric mask with light which emits an electron beam of a predetermined pattern, said electron beam irradiating the predetermined region of the sample.

4. A method according to claim 1, wherein the exposure pattern is formed by delineating the predetermined region.

5. A method according to claim 1, wherein the step of performing the auxiliary exposure is performed by a beam source which is one of an electron beam, an ion beam, an ultraviolet ray, a far ultraviolet ray an an X-ray.

6. A method according to claim 1, wherein the step of performing the auxiliary exposure occurs at a voltage of not less than 40 keV.

7. A method according to claim 1, wherein the pattern is formed on a radiation-sensitive film of the sample.

8. A method according to claim 1, further comprising the subsequent step of performing a secondary auxiliary exposure which exposes the entire surface of said sample with either a charged beam or an electromagnetic wave.

9. A method according to claim 1, further comprising the step of selectively performing a third irradiation on a specific correction pattern region with either a charged beam or an electromagnetic wave.

10. A method of forming a fine pattern with a charged beam, comprising the steps of:
    performing a first irradiation of a predetermined region of a sample with a charged beam to form an exposed pattern on the sample; and
    performing a second irradiation of the predetermined region and a region around said predetermined region with either a charged beam or an electromagnetic wave, and at a dose smaller than the dose for forming the exposure pattern, to perform an auxiliary exposure, the auxiliary exposure being such that a molecular amount distribution remains substantially unchanged along the direction of thickness of said region around the pattern of the sample wherein the step of performing the auxiliary exposure occurs at a voltage of not less than 30 keV.

11. A method according to claim 10, wherein the step of performing the auxiliary exposure is performed at a dose which is less than 50% of the dose for forming the exposure pattern.

12. A method according to claim 10, wherein the step of forming the exposure pattern comprises the step of irradiating a photoelectric mask with light which emits an electron beam of a predetermined pattern, said electron beam irradiating the predetermined region of the sample.

13. A method according to claim 10, wherein the exosure pattern is formed by delineating the predetermined region.

14. A method according to claim 10, wherein the step of performing the auxiliary exposure is performed by a beam source which is one of an electron beam, an ion beam, an ultraviolet ray, a far ultraviolet ray and an X-ray.

15. A method according to claim 10, wherein the step of performing the auxiliary exposure occurs at a voltage of not less than 40 keV.

16. A method according to claim 10, wherein the pattern is formed on a radiation-sensitive film of the sample.

17. A method according to claim 10, comprising the further step of performing a third irradiation on entire sample with either a charged beam or an electromagnetic wave after the step of performing a second irradiation of predetermined region of said sample to form an exposed pattern.

* * * * *